(12) United States Patent
Pellegrino et al.

(10) Patent No.: US 11,415,642 B2
(45) Date of Patent: Aug. 16, 2022

(54) DEVICE FOR SENSING A MAGNETIC FIELD

(71) Applicants: CONSIGLIO NAZIONALE DELLE RICERCHE, Rome (IT); UNIVERSITA' DEGLI STUDI "G. D'ANNUNZIO" CHIETI-PESCARA, Chieti (IT); QUANTIFIED AIR BV, Leiden (NL)

(72) Inventors: Luca Pellegrino, Genoa (IT); Nicola Manca, Albenga (IT); Daniele Marre', Genoa (IT); Federico Remaggi, Genoa (IT); Riccardo Bertacco, Morazzone (IT); Federico Maspero, Milan (IT); Warner Jurriën Venstra, Leiden (NL); Stefania Della Penna, Pescara (IT); Ingo Hilschenz, Chieti (IT); Alexei Kalaboukhov, Mölnlycke (SE); Filomena Lombardi, Gothenburg (SE)

(73) Assignees: CONSIGLIO NAZIONALE DELLE RICERCHE, Rome (IT); UNIVERSITA' DEGLI STUDI "G. D'ANNUNZIO" CHIETI-PESCARA, Chieti (IT); QUANTIFIED AIR BV, Leiden (NL)

( * ) Notice: Subject to any disclaimer, the term of this patent is extended or adjusted under 35 U.S.C. 154(b) by 0 days.

(21) Appl. No.: 17/231,297

(22) Filed: Apr. 15, 2021

(65) Prior Publication Data

US 2021/0325484 A1 Oct. 21, 2021

(30) Foreign Application Priority Data

Apr. 15, 2020 (EP) ..................................... 20169544

(51) Int. Cl.
*G01R 33/00* (2006.01)
*G01R 33/032* (2006.01)

(52) U.S. Cl.
CPC .................. *G01R 33/0327* (2013.01)

(58) Field of Classification Search
CPC ......................... G01R 33/00; G01R 33/0035; G01R 33/0023; G01R 33/0017; G01R 31/3191;
(Continued)

(56) References Cited

U.S. PATENT DOCUMENTS

2006/0220641 A1* 10/2006 Pannetier ............. G01R 33/035
324/248
2006/0226827 A1* 10/2006 Pannetier ............. G01R 15/205
324/127

(Continued)

OTHER PUBLICATIONS

Ling Hao et al: "Focused Ion Beam NanoSQUIDs as Novel NEMS Resonator Readouts", IEEE Transactions on Applied Superconductivity, IEEE Service Center, Los Alamitos, CA, US, vol. 19, No. 3, Jun. 1, 2009.

(Continued)

*Primary Examiner* — Jermele M Hollington
*Assistant Examiner* — Taqi R Nasir
(74) *Attorney, Agent, or Firm* — ArentFox Schiff LLP; Michael Fainberg

(57) ABSTRACT

A device for sensing a magnetic field, comprising a closed superconducting loop configured to collect a magnetic field to be sensed, hereinafter external magnetic field, the closed superconducting loop having a path width ($w_p$) and being provided with a constriction having a width ($w_c$) narrower than the path width, the constriction generating a non-uniform magnetic field, hereinafter internal magnetic field, in response to the external magnetic field, a vibrating mechanical oscillator coupled to, or formed by the constriction and responsive to the internal magnetic field, and a detector configured to detect deflection or vibration of the mechanical oscillator and providing a signal indicative of the deflection or vibration.

16 Claims, 12 Drawing Sheets

(58) Field of Classification Search
CPC .... G01R 33/0327; G01B 7/004; G01C 17/38; G06F 3/017; G06F 3/0346; G06F 3/012
See application file for complete search history.

(56) References Cited

U.S. PATENT DOCUMENTS

2007/0194225 A1    8/2007  Zorn
2013/0096825 A1*  4/2013  Mohanty ................. H03B 5/30
                                                   701/472

OTHER PUBLICATIONS

Tanmoy Bera et al: "Large flux-mediated coupling in hybrid electromechanical system with a transmon qubit", arxiv.org, Cornell University Library, 201 Olin Library Cornell University Ithaca, NY 14853, Jan. 16, 2020 (Jan. 16, 2020), XP081579981,p. 1, col. 2, paragraphs 2,3 pp. 2-5.

* cited by examiner

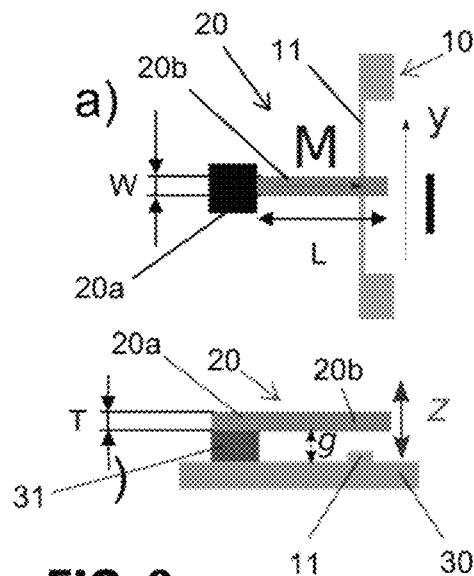
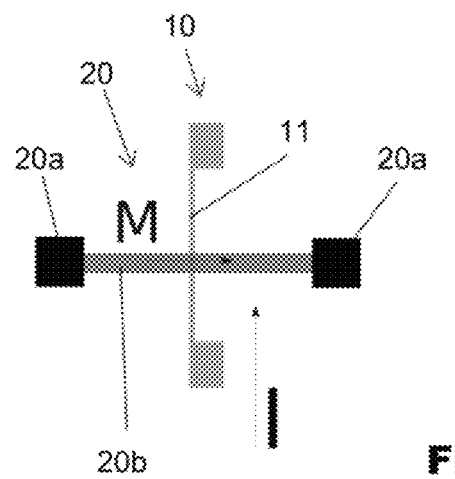
FIG. 6a
FIG. 6B
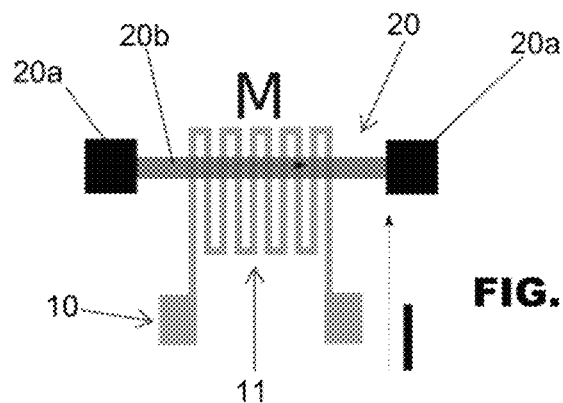
FIG. 6C
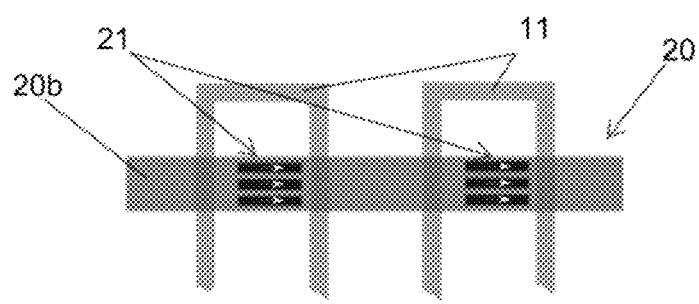
FIG. 6D

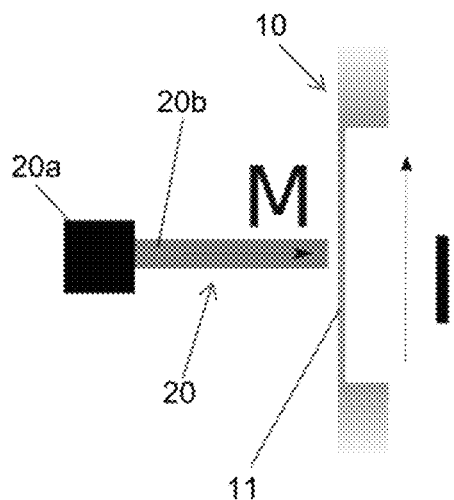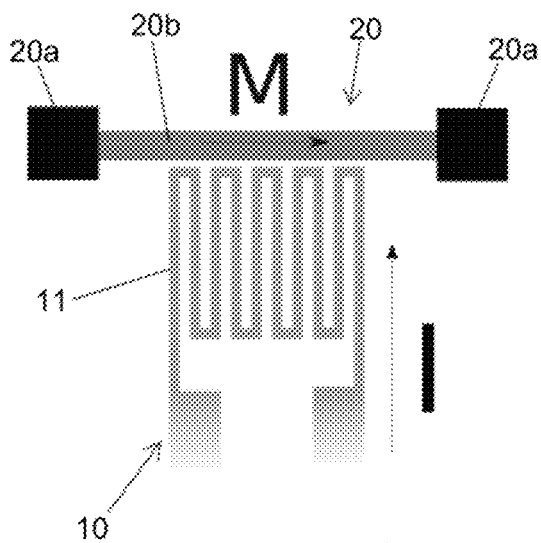
FIG. 8A    FIG. 8B
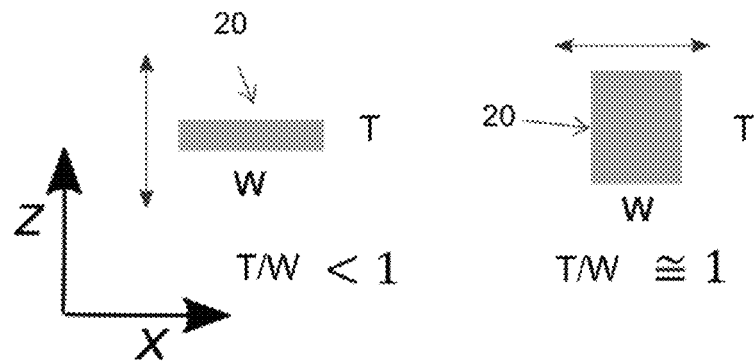
FIG. 9
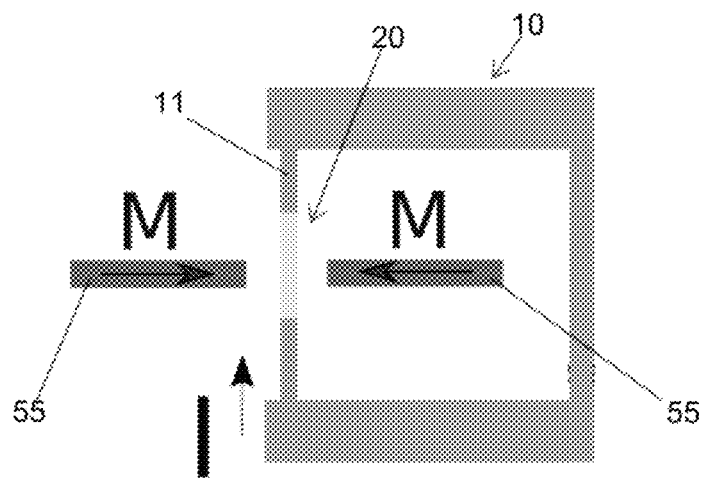
FIG. 10

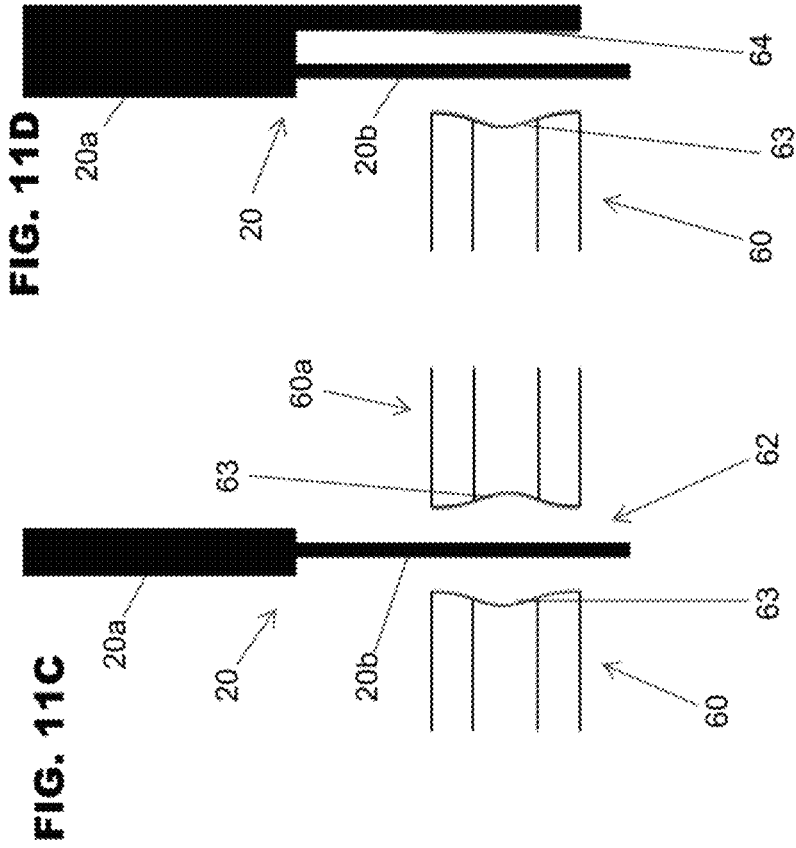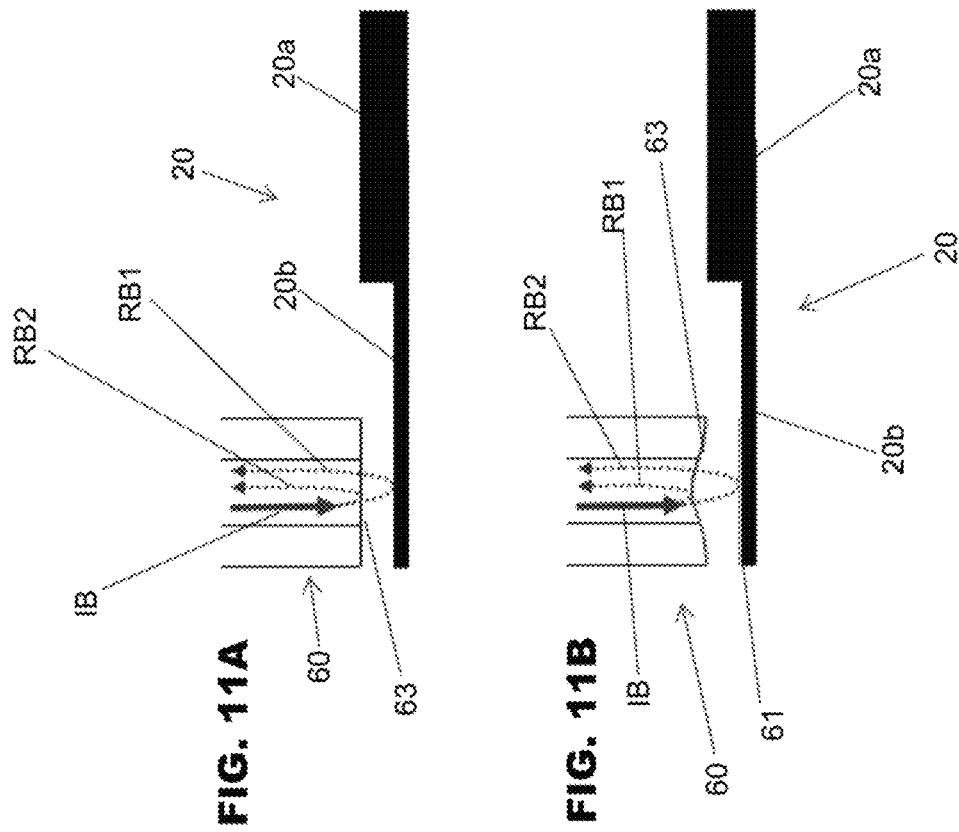

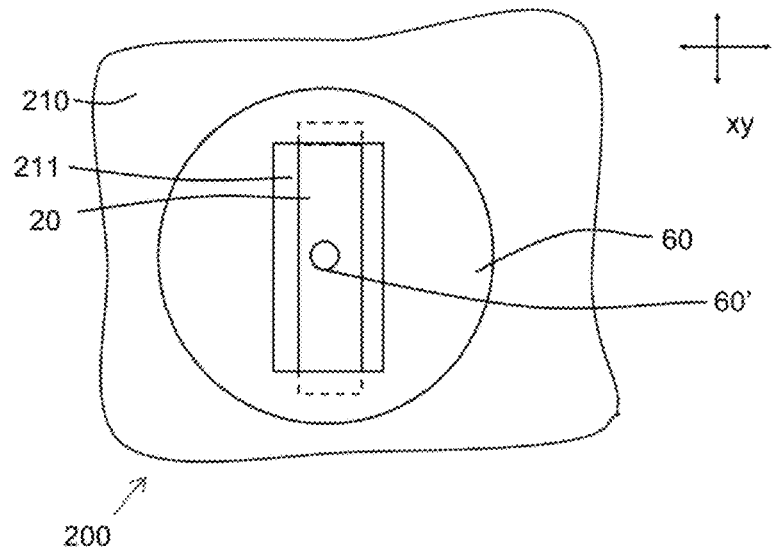
FIG. 15A
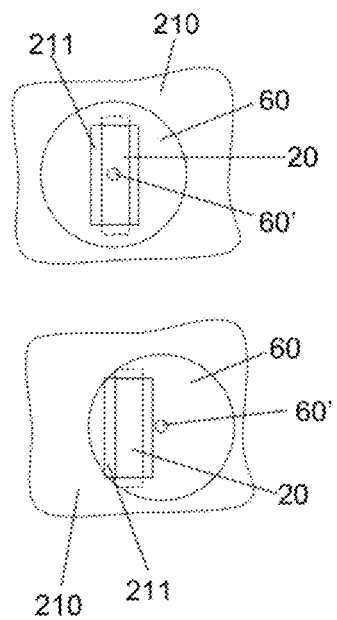
FIG. 15B
FIG. 15C
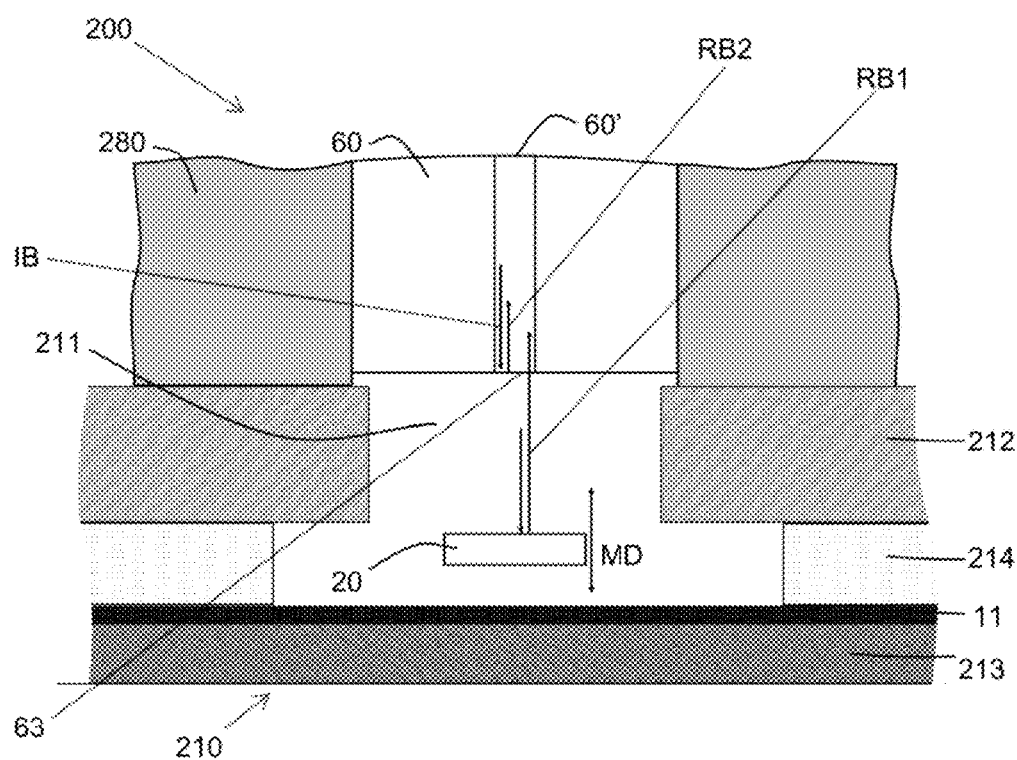
FIG. 16

DEVICE FOR SENSING A MAGNETIC FIELD

CROSS-REFERENCE TO RELATED APPLICATION

This application claims priority to European Patent Application No. 20169544.2 filed on Apr. 15, 2020, the entire contents of which is hereby incorporated in its entirety by reference The project leading to this application has received funding from European Union's Horizon 2020 research and innovation programme under grant agreement No. 828784.

FIELD OF THE INVENTION

The present invention relates to the specific class of magnetic field sensors having among the highest achievable sensitivity, which can be integrated into packages with dimension of the order of few $cm^3$. One exemplary application of these sensors can include, but not limited to, biomagnetism, i.e. the measure and study of very small fields (~1-100 fT) generated by biological processes such as brain or muscle activity, as in magnetoencephalography (MEG) or magnetocardiography (MCG), or by magnetized tissue, as in Ultra Low Field MRI, even in strong (~1T) applied fields as in Transcranial Magnetic Stimulation (TMS).

BACKGROUND OF THE INVENTION

Examples of these device technologies are superconducting quantum interference devices (SQUIDs), Optically Pumped Magnetometers (OPMs), magnetometers based on Nitrogen-Vacancies centers (NV-centers), magnetoelectric sensors, giant magnetoresistive sensors (GMR), and magnetic field sensors based on microelectromechanical systems.

SQUIDs operation is based on quantum interference effects. SQUIDs are among the most sensitive magnetic field sensors, with a magnetic field equivalent noise floor of about 1 fT/sqrt(Hz). They can be integrated into small spaces and are produced using planar lithographic technology. The technology of low temperature superconductors (LTS) (e.g. niobium) SQUIDs is well developed and currently used in biomagnetism. As an example, commercial systems based on LTS SQUIDs allow to detect the brain magnetic field, in the order of a few femtotesla with a bandwidth from 0 to 1 kHz. As reference, a helmet for magnetoencephalography (MEG) would require at least 100 integrated magnetic field sensors. LTS SQUIDs require liquid helium cooling (4.2K). Instead, SQUIDs made of high temperature superconducting (HTS) materials such as YB2Cu3O7 are able to work at liquid nitrogen temperatures (77K). HTS SQUIDs are noisier as compared with LTS SQUIDs and suffer from lower reproducibility. LTS and HTS SQUIDs in general are not robust to strong externally applied fields (>150 mT in case of LTS SQUIDs based on field-tolerant design, much lower values for HTS SQUIDs), limiting their applicative potential if external magnetic perturbations cannot be completely ruled out. For this reason, SQUID-based sensing cannot be combined with other imaging modalities such as High Field MRI or Transcranial Magnetic Stimulation (TMS), where large static and pulsed magnetic fields (~1 T) are applied.

Optically Pumped Magnetometers (OPM) detect magnetic-field-induced modulations of the transmission of light through a hyperpolarized gas (e.g. Rb). The magnetic field equivalent noise floor of such sensors is in the order of tens of fT/sqrt(Hz) in a bandwidth DC-100 Hz. This technology currently works at high temperature and has some limits such as limited bandwidth, integration, scalability and costs. In addition, this type of devices suffers from the influence of the background magnetic field on the sensor calibration, requiring suitable techniques to ensure repeatability.

Magnetometers based on Nitrogen-Vacancy (NV) centers in diamond can reach noise floor values down to pT/sqrt (Hz). They work by detecting the change of fluorescence of a NV ensemble irradiated by laser under microwave irradiation. Such technology can be used to detect magnetic fields with high spatial resolution at the expense of sensitivity. Also, this technology requires a complex scheme to excite and probe the NV ensemble. NV magnetometers with nT/sqrt(Hz) magnetic field equivalent noise floor integrated into a compact box (11×7×7 cm3) have been recently presented.

Magnetoelectric sensors operate by generating a voltage owing to mechanical stress caused by magnetic fields. These sensors can be realized into compact devices and are often fabricated using laminated composites made by integrating a piezoelectric layer and a magnetostrictive element. PZT/Terfenol-D is an example of such an approach. Magnetoelectric laminates work in passive mode and can reach noise level of the order of pT/Sqrt(Hz) in the low frequency regime.

The key principle for Cavity optomechanical resonators (COMS) is to combine microscale cavity optomechanics with magnetostrictive magnetometry. In a COMS-based sensor, a magnetostrictive material is coupled to a mechanical oscillator. A modulated magnetic field generates mechanical stress on the COMS structure and sets it into oscillation, mainly at its mechanical eigenmode. Microscale on-chip resonators (e.g. whispering gallery mode resonators) have achieved a magnetic field equivalent noise at megahertz frequencies of about 200 pT/sqrt(Hz). However, due to noise sources and poor low frequency mechanical response below the mechanical eigenmode of the resonator, magnetic field sensing in the hertz to kilohertz frequency range has been achieved exploiting the inherent mechanical nonlinearities within the magnetostrictive material, with an achieved noise of about 110 nT/sqrt(Hz).

Another class of magnetic field sensors employs Micro-ElectroMechanical Systems (MEMS) or Nanoelectromechanical Systems (NEMS) with potential appeal for the development of high sensitivity magnetic field detection. MEMS sensors have concrete potentialities for real-world applications owing to high sensitivity and good resolution, small size, wide dynamic range, low power consumption, and possibilities for fabrication using surface micromachining processes. A major part of the MEMS sensors functionality is based on exploiting the Lorentz force (Lorentz force magnetometers) that is generated when electrical current is applied to the micromechanical structure immersed in an external magnetic field. The Lorentz force causes a deformation of the structure, as well as a change in one or more of its resonance frequencies. These can be detected using a suitable transducer, which may be fabricated on-chip, or organized externally. Examples of on-chip transducers are piezoelectric, piezoresistive, magnetomotive and capacitive transducers. External transducers are typically optical and based on either interference or reflectometry. Lorentz force magnetometers usually can detect fields in the order of nanotesla. Flexural or Torsional type Lorentz force magnetometers have been developed.

Lorentz force type MEMS magnetometers need to use an external current bias to work. Other approaches to MEMS magnetometers use a micromechanical element coupled to the external magnetic field through magnetic elements. The micromechanical system can be integrated with a magnetic particle or a soft or hard magnetic layer and coupled to the external field via magnetic circuits. Resonant MEMS sensors work either in amplitude modulation mode by measuring the oscillation amplitude at a given excitation frequency or in frequency modulation mode, by tracking the change of mechanical resonance.

In some technical applications, the external magnetic field is amplified using magnetic flux concentrators consisting of magnetic materials. Such a system amplifies the magnetic field nearby the magnetic field detector. The typical gain factor of a magnetic flux concentrator is around 50, depending on its geometry and the chosen material. Magnetic field concentrators technology can also take advantage from mobile MEMS structures able to modulate the magnetic field and reject low frequency noise. This approach has been commonly used in magnetoresistive type sensors (GMR or TMR as an example).

A different system for the amplification of the magnetic field uses a superconducting microstrip (WO 2004/068158 A1). This system works at low temperature, below the superconducting transition temperature of the chosen superconducting material. In such a system, a loop made with a superconducting microstrip converts its concatenated magnetic flux into a circulating supercurrent. This current flows into a constriction of nanometric dimension. In the region around the constriction the magnetic field is amplified. Nearby the constriction a magnetic field sensor is placed, made with a GMR or TMR head that probes the amplified magnetic field. Such an approach has demonstrated a limit of detection of about 30 fT/Sqrt(Hz) at frequencies above 100 Hz.

One aim of the invention is to provide a solution that is capable of at least partially overcoming the drawbacks of the conventional devices.

SUMMARY OF THE INVENTION

Accordingly, the invention proposes a device for sensing a magnetic field, comprising a closed superconducting loop configured to collect a magnetic field to be sensed, hereinafter external magnetic field, said closed superconducting loop having a path width and being provided with a constriction having a width narrower than said path width, said constriction generating an amplified and non-uniform local magnetic field, hereinafter internal magnetic field, in response to said external magnetic field, a vibrating mechanical oscillator coupled to, or formed by said constriction and responsive to the internal magnetic field, and a detector configured to detect deflection or vibration of said mechanical oscillator and providing a signal indicative of said deflection or vibration.

The present invention concerns a device, referred to as "hybrid sensor" to detect ultra-small magnetic fields while ensuring robustness to external DC and pulsed applied fields. The foreseen limit of detection of the hybrid device is of the order of 10 fT/sqrt(Hz).

According to the invention, a superconducting coil is coupled to a mechanical resonator. The superconducting coil concentrates (magnetic flux concentrator, MFC) or shapes (field-to-gradient converter, FGC) the magnetic field collected by the coil in its surroundings acting as an Magnetic Field or Field Gradient amplifier, thus improving the sensitivity of the resonator possibly by a factor of 1000. Such a system is made with a superconducting microcircuit realized with planar technology. This system is in the form of a loop with a constriction of nanometric dimensions, realized in different geometries. An external magnetic field, which is supposed to be measured, will generate a (superconducting) current circulating in the loop and therefore generate a magnetic field at the nanoconstriction. Due to the optimized shape of the nanoconstriction, the field will then couple to the magnetic mechanical oscillator, changing its mechanical behavior. An external magnetic field is thus expected to change the mechanical resonance frequency of the coupled resonator. The resonance frequency is preferentially monitored by an optical transducer.

The overall design has multiple advantages over the present SQUID-based detectors. Firstly, the hybrid device is robust to applied static and pulsed electromagnetic fields, which enables new multimodal imaging approaches using biomagnetic fields, impossible to implement with the (SQUID) detectors presently available. Only in case of extreme measurement conditions, such as the application of large pulsed magnetic fields as in TMS, a local compensation coil could be used to ensure safe operation of the superconducting loop. Secondly, thanks to the optical detection, multiple channels can be operated simultaneously without inter-channel cross-talk. This condition is relevant in, for instance, a MEG imaging system that may require over 100 channels to operate simultaneously. Thirdly, the output of the optical transducer is easily transported, multiplexed and detected at a high bandwidth and at a high signal-to-noise ratio, allowing an easier and more versatile integration of MEG with other techniques (e.g. allowing the detection of MRI signals at multiple values of the applied field in the ULF/VLF range).

The realization of the hybrid sensor requires the use of materials having different functionalities. In an embodiment, Transition Metal Oxides (TMOs) are used to address such a need by realizing integrated nanomechanical sensors and superconducting nanostructures.

BRIEF DESCRIPTION OF THE DRAWINGS

Some preferred, but non-limiting, embodiments of the invention will now be described with reference to the attached drawings, in which.

(light line).

Figure 4A:
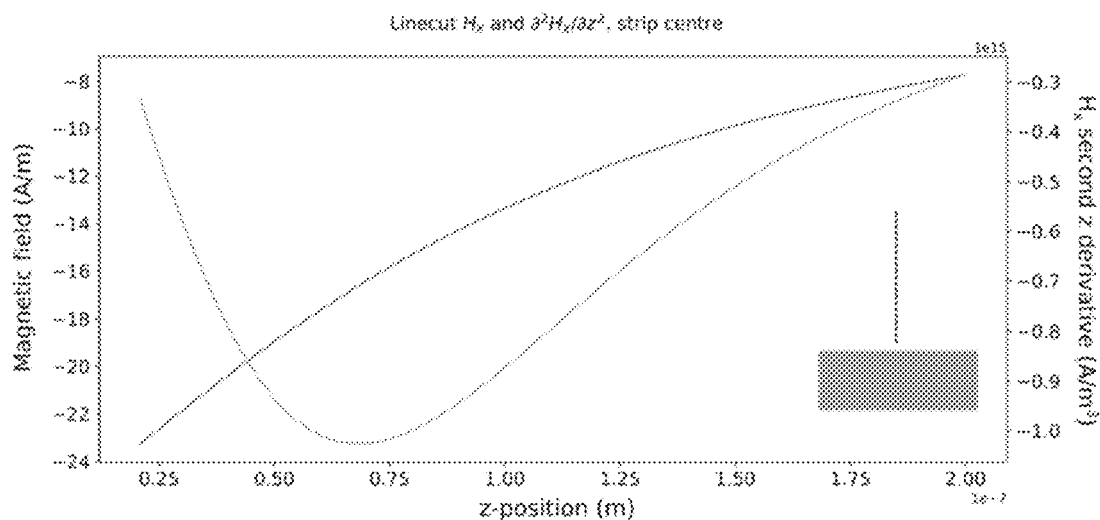
FIGS. 4a and 4b are plots showing vertical line profiles of the magnetic field in the x direction $H_x$ (dark line) and its second order spatial derivative along z, $$\frac{\partial^2 H_x}{\partial z^2}$$
Figure 4B:
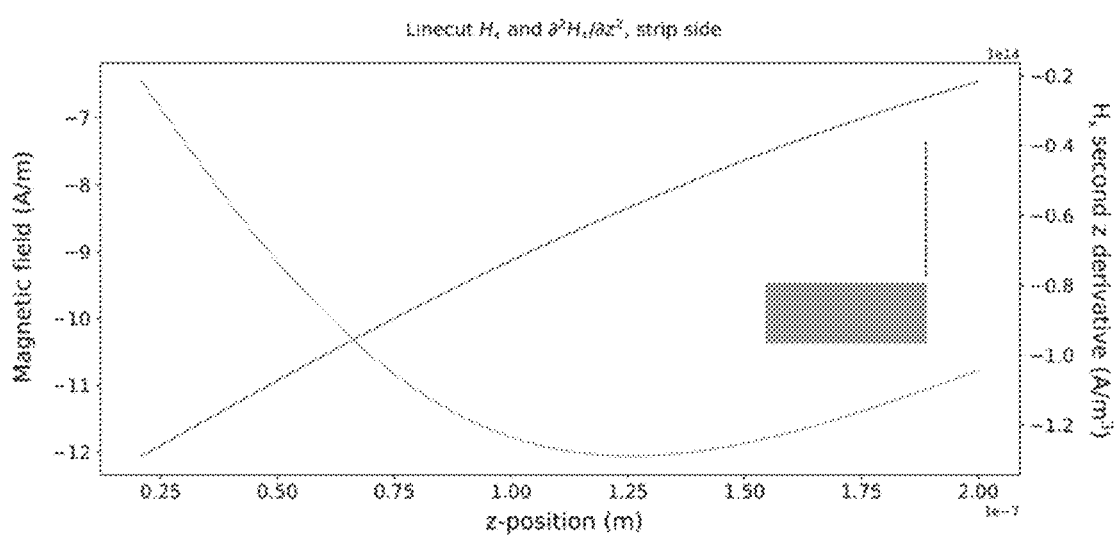
Figure 5A:
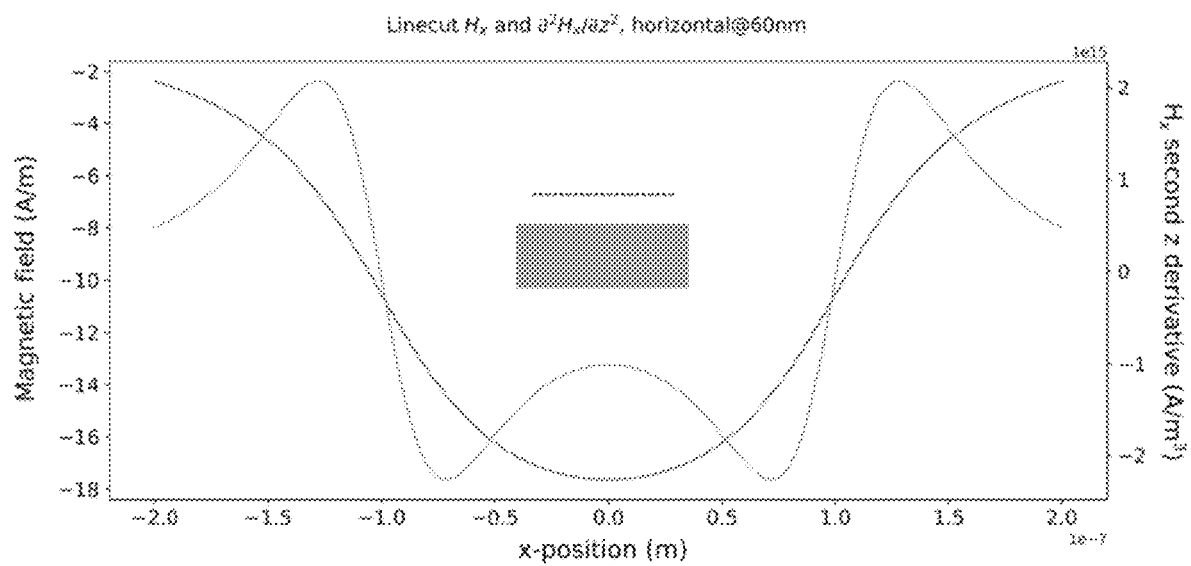
Figure 5B:
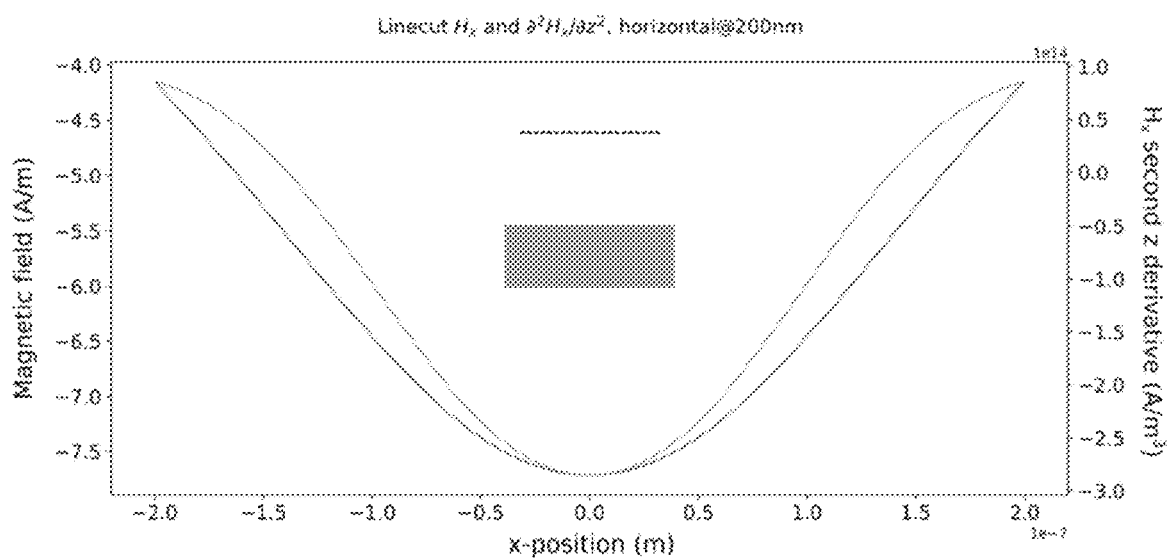

FIG. 4a: line profile calculated along the center of the constriction (X=0 nm). FIG. 4b: line profile calculated at the edge of the constriction (X=100 nm);

FIGS. 5a and 5b are plots showing horizontal line profiles of the magnetic field in the x direction $H_x$ (dark line) and its second order spatial derivative along z, $$\frac{\partial^2 H_x}{\partial z^2}$$

Figure 7A:
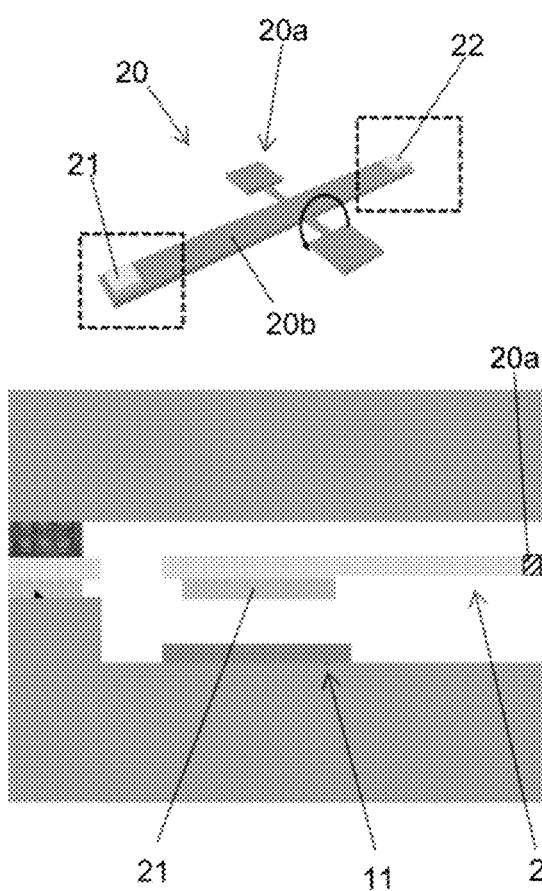
Figure 7B:
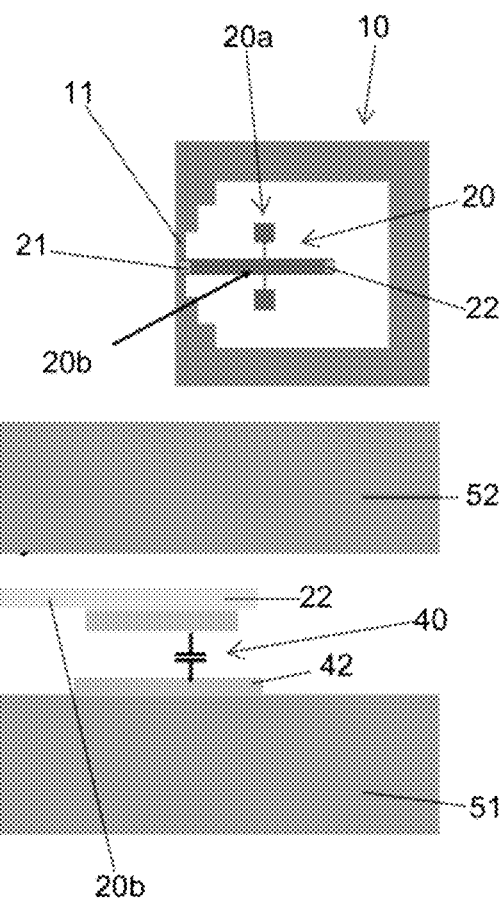
Figure 7C:
Figure 12:
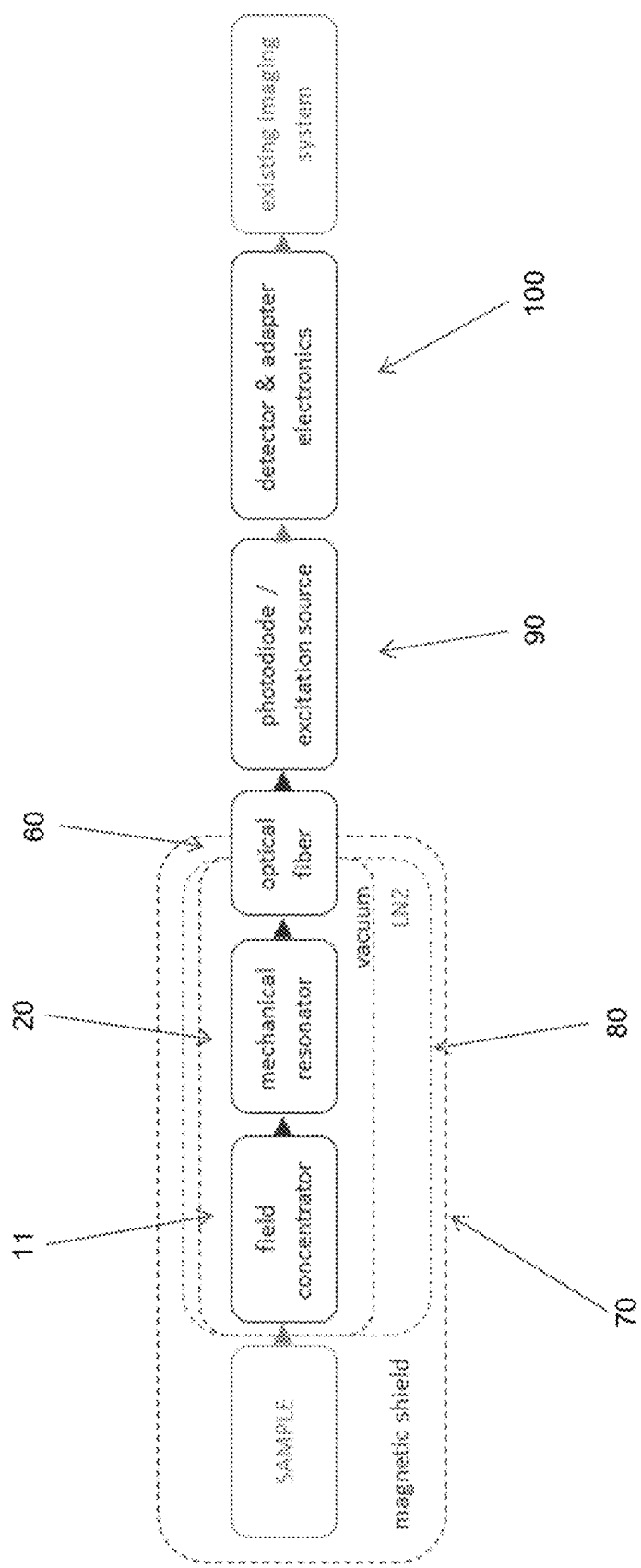
Figure 13:
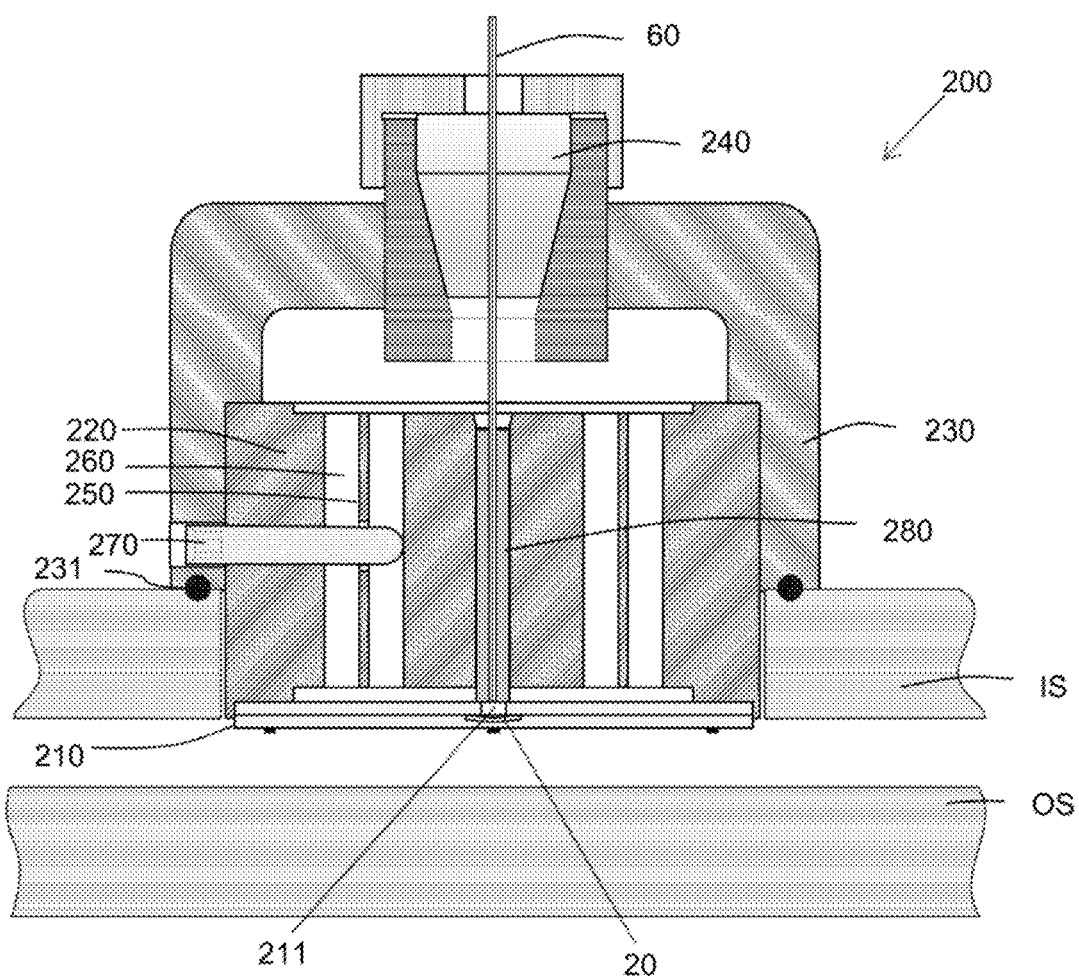
Figure 14:
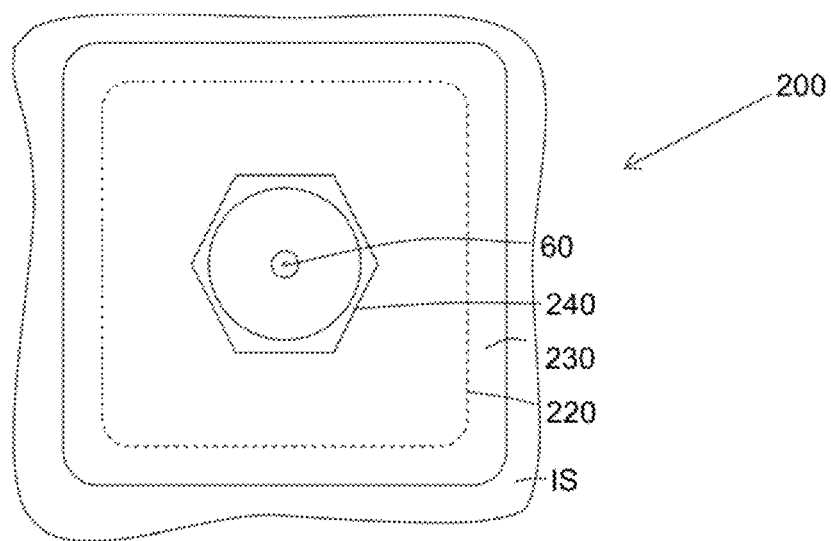
Figure 17:
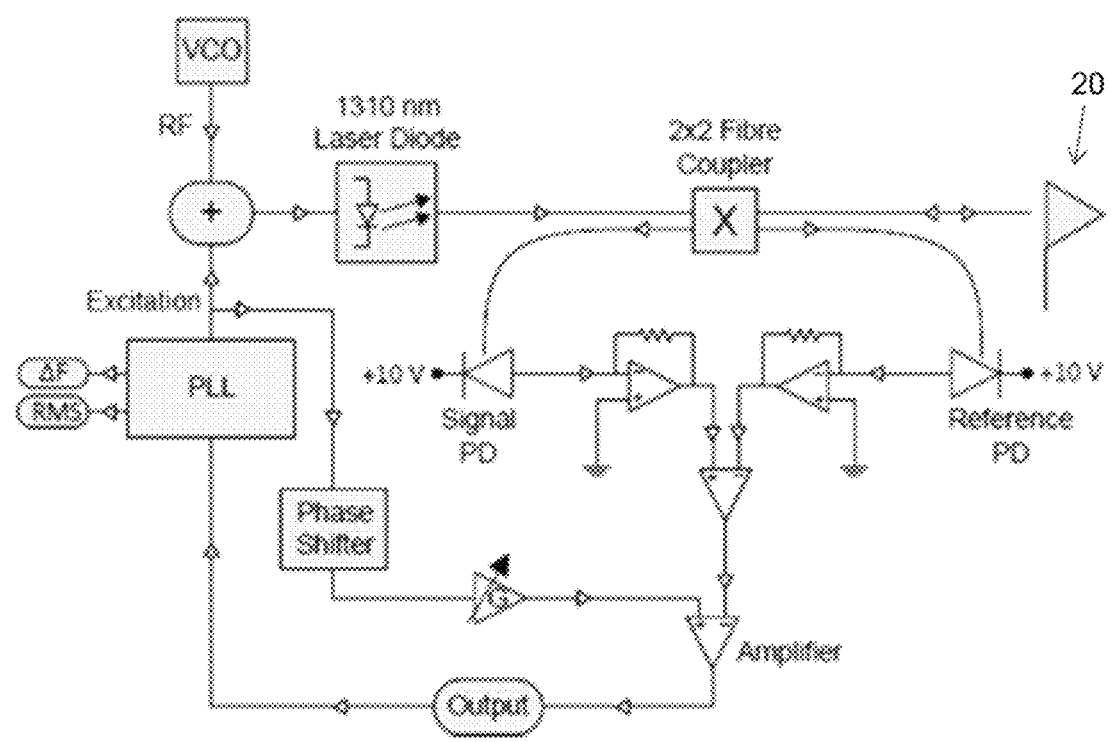

(light line). FIG. 5a: line profile is calculated on top of the constriction at a height of 60 nm. FIG. 5b: line profile calculated at a height of 200 nm;

FIGS. 6a, 6b, 6c, 6d show different embodiments of a device according to the invention, comprising a constriction and a mechanical resonator;

FIG. 7a, 7b, 7c are a perspective view, top view and cross-section, respectively, showing a further embodiment of a device according to the invention;

FIGS. 8a and 8b shows further embodiments of a device according to the invention;

FIG. 9 shows that lateral movement of the mechanical resonator can be achieved if fabricating structures with large height-to-width ratio;

FIG. 10 shows a further embodiment using a freestanding superconducting constriction and permanent magnets;

FIGS. 11a, 11b, 11c, 11d show different fiber interferometric optical detection schemes for a device according to the invention;

FIG. 12 is a block scheme of a read-channel for a device according to the invention;

FIG. 13 is a cross-sectioned view showing a biomagnetic channel assembly employing a device according to the invention;

FIG. 14 is a top view of the biomagnetic channel assembly of FIG. 13;

FIGS. 15a, 15b, 15c are enlarged top views showing positioning of a fiber tip with respect to the mechanical resonator;

FIG. 16 is an enlarged cross-section showing positioning of the fiber tip with respect to the mechanical resonator; and FIG. 17 shows a schematic diagram of a fiber interferometer circuit [celik et al., Rev. Sci. Instrum. 88, 013705 (2017)] which can be used in a device according to the invention.

DETAILED DESCRIPTION

The operating principle of a magnetic field sensor according to the invention is explained with reference to FIGS. 1a and 1b.

Figure 1A:
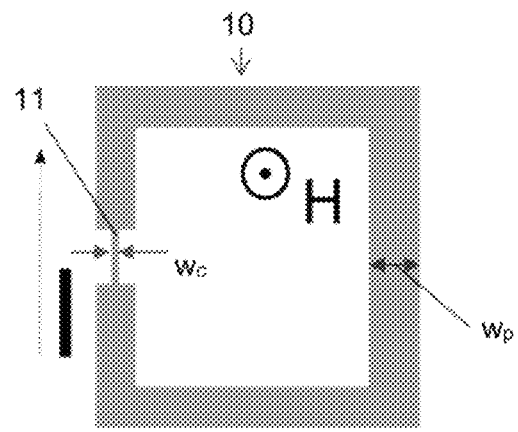
FIGS. 1a and 1b are schemes showing the operating principle of a magnetic field sensor according to the invention.
Figure 1B:
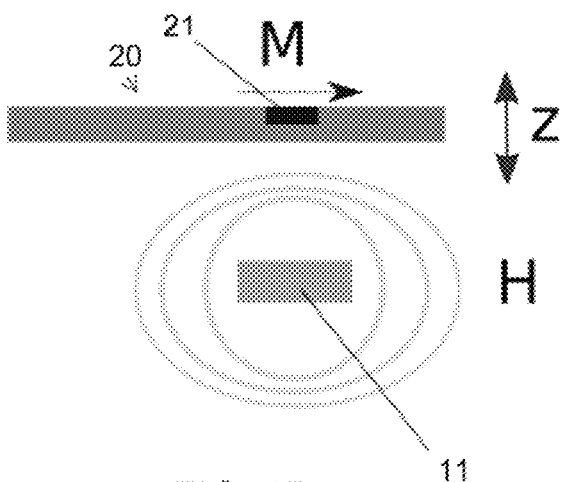

FIG. 1a shows a closed superconducting loop 10 configured to collect a magnetic field H to be sensed. The closed superconducting loop 10 has a path width $w_p$ and is provided with a constriction 11 having a width $w_c$ narrower than the path width $w_p$. FIG. 1b shows a vibrating mechanical oscillator 20 comprising a portion 21 of magnetic material having magnetization M and positioned close to, particularly on top of, the constriction 11. The arrow z indicates the oscillation directions of the mechanical oscillator 20.

To devise useful design criteria for an optimal mechanical magnetic field sensor, it is essential to analyse the magnetic interaction between an arbitrary external magnetic field $H=(H_x, H_y, H_z)$ and a small magnetic element 21 with magnetization $M=(M_x, M_y, M_z)$. It can be expressed by a force density f that is exerted on the small magnetic element with uniform magnetization M due to the presence of a non-uniform magnetic stray field H emanating from a sample:

$$f = \mu_0 (M \cdot \nabla) H. \quad (1)$$

If the magnetic element is part of a vibrating cantilever 20 that oscillates unperturbed with its natural eigenfrequency of its first flexural mode $v_0$ along the z-axis, the frequency change $\partial v/v_0$ due the presence of a magnetic field is given by the magnetic force gradient $\partial F_z/\partial z$. This approximation is true as long as the magnetic field change is small compared to the oscillation amplitude A. In this case, the magnetic interaction acts as a softening or hardening of the cantilever spring constant k, i.e., the effective spring constant is given by $k_{eff} = k - \partial F_z/\partial z$.

In the point dipole approximation (field variations are small on the length scale of the magnetic particle), the magnitude of $\partial F_z/\partial z$ depends on the second order spatial derivative of all three components of the magnetic field $H=(H_x, H_y, H_z)$ in z-direction and on the magnitude of the cantilever magnetization $M=(M_x, M_y, M_z)$, as shown in equation (2):

$$\frac{\partial F_z}{\partial z} = \mu_0 \left( M_x \frac{\partial^2 H_x}{\partial z^2} + M_y \frac{\partial^2 H_y}{\partial z^2} + M_z \frac{\partial^2 H_z}{\partial z^2} \right) \quad (2)$$

Note that each spatial component of the magnetization vector couples with the second derivative of the external magnetic field component parallel to the direction of the cantilever oscillation, i.e., the z-direction in (2). Obviously, data interpretation further simplifies, if the cantilever magnetization only has one component, e.g., $M=(M_x, 0, 0)$.

Taking these considerations into account, the magnetized area of the cantilever should be relatively small, otherwise the above assumed dipole approximation is not valid. More importantly, it avoids averaging effects. Of course, the magnetization of the force probe should be large and oriented parallel to the magnetic field component of interest.

According to the formula given in (2), it is desirable to generate a large non-uniformity, i.e., a large curvature, of the magnetic field. To do so, the mechanical oscillator 20 will be an integral part of a hybrid sensor that also provides a field-to-gradient converter (FGC) that magnifies the sensitivity to the weak magnetic fields we aim to detect.

The primary solution for the FGC is a superconducting nanoconstriction 11 made of a high Tc superconducting (SC) material. The external magnetic field enters a ring or loop 10 made of a SC thin film structure. An electrical current (supercurrent) thus flows on this ring in order to screen the external magnetic field. The higher current density flowing inside the ring constriction 11 amplifies the magnetic field in the regions around the constriction itself. Even if the original field is rather homogeneous, the constriction generates a large curvature of the field lines, which, as explained above, generates a large force gradient and thus a strong interaction with the magnetized cantilever. This geometrical feature for field amplification has been used before by M. Pannetier et al. (WO 2004/068158 A1) in order to increase the magnetic field around a magnetic field detector made of a giant magnetoresistive (GMR) device.

The external magnetic field, produced by, for example, brain activity or magnetized tissue, is thus collected and transduced into a supercurrent that in turn changes the mechanical response of the vibrating magnetic cantilever or any other suitable vibrating magnetic micro- or nanostructure that acts as mechanical sensor.

By detecting, e.g., changes of the resonance frequency of a magnetically sensitive mechanical oscillator, we can define the responsivity of the hybrid sensor in units of Hz/T.

Various resonant modes can be deployed to transduce the magnetic signal, such as the fundamental and or higher flexural or torsional resonance modes. Depending on geometry, the said superconducting constriction may couple more strongly to a specific higher-order mode, which makes this mode most suitable for the detection. In some cases, detecting multiple modes simultaneously may prove beneficial in order to obtain a higher resolution of the magnetic field.

Mechanical sensing is not restricted to cantilever geometries—bridges, drums, membranes, microdisks or trampolines can be employed as well. The main issue here is the spring constant k and the mechanical Q-factor, because the minimal detectable force gradient scales as $\partial F_z/\partial z \propto (k/(Q v_0))^{1/2}$. Thus, Q and $v_0$ should be as large as possible and k as small as possible to increase the sensitivity of the mechanical oscillator.

The superconducting constriction 11 is the core of the magnetometer field-to-gradient converter. The constriction is part of a superconducting ring circuit 10 (e.g. a simple or multiloop magnetometer) that collects the external magnetic flux (either coupled directly into the ring circuit, or induced into the ring circuit via a transformer) resulting in a circulating supercurrent, whose magnitude and time-dependent behaviour depends on the external magnetic field. Given the external field H and its component perpendicular to the loop $H_a$, the supercurrent I is proportional to the ring area S and depends on the width of the ring $w_p$ and its radius r (circular ring):

$$I = \frac{H_a S}{\mu_0 r \left[\ln\left(\frac{8r}{w_p}\right) - 2 + \frac{7w_p}{4r}\right]} \quad (3)$$

The mechanical oscillator 20 is placed nearby the constriction area. Generally, possible solutions include single constrictions or meander-like SC constrictions or spiral-like SC constrictions, or a spiral-like loop with multiple constrictions as shown in FIGS. 2a-e.

Figure 3A:
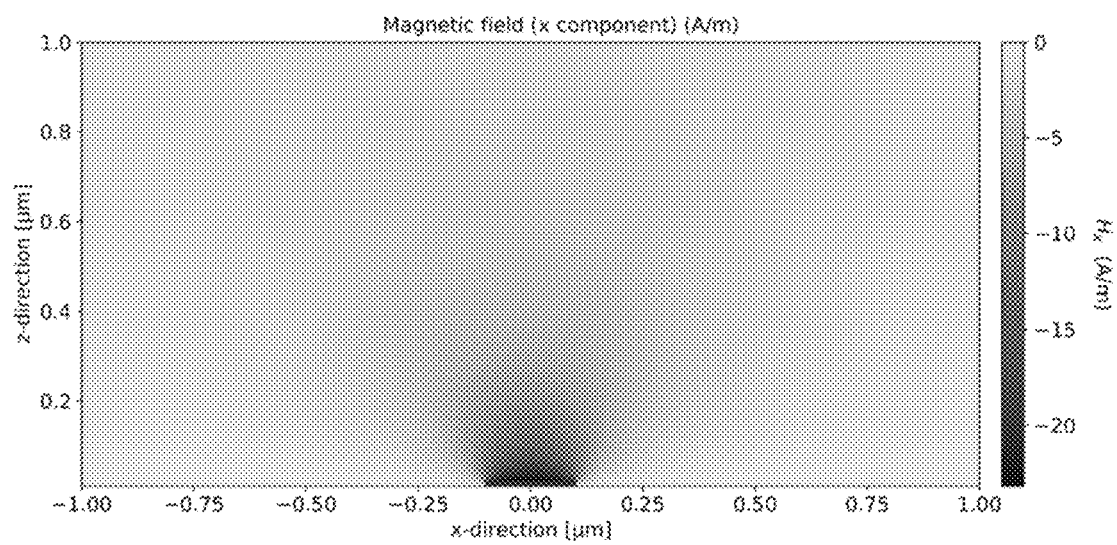
FIGS. 3a and 3b are plots showing magnetic field components $H_x$ and $H_z$ in A/m generated by a superconducting constriction 200 nm wide×20 nm thick.
Figure 3B:
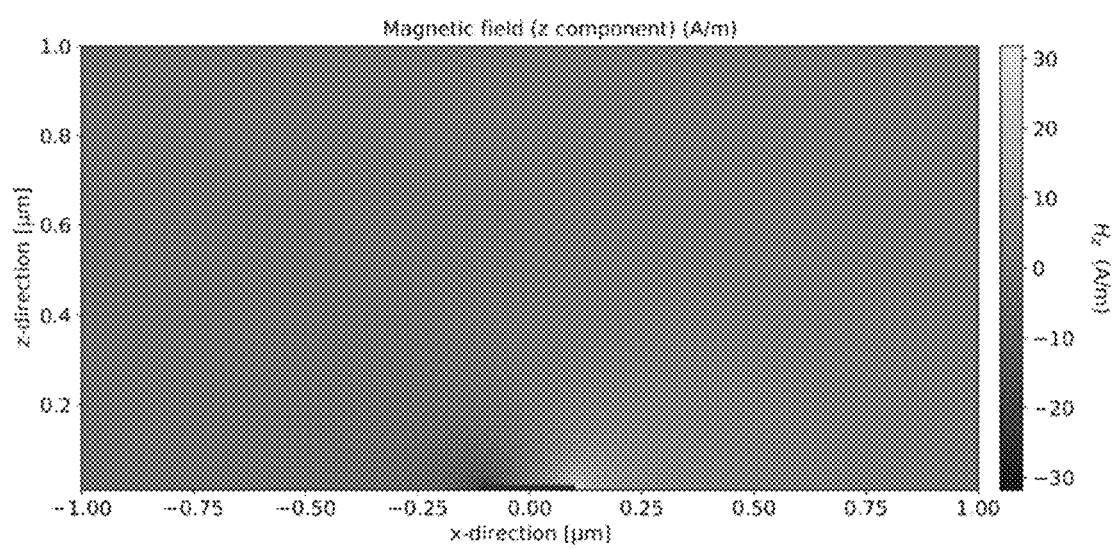

As an example, FIGS. 3a-b report the two components of the magnetic field around a rectangular constriction with dimensions 200 nm (width)×20 nm (thickness). The electrical current has been set to 10 µA, which is a reasonable and safe value for a High-Tc microstrip and considered as a first approximation homogeneously distributed over the cross section.

For magnetic thin film structures deposited on planar mechanical oscillators, the magnetization M is usually oriented in the plane due to shape anisotropy energy. The field gradients along the y-direction is almost zero, thus the main magnetization component we consider here is the x component of the magnetization $M_x$.

Also, the magnetic field in the x-direction and its Second Order Spatial Derivative (SOSD) along z, $$\frac{\partial^2 H_x}{\partial z^2},$$

are reported for two vertical line sections in the middle and at the edge of the constriction (FIGS. 4a and 4b). The horizontal line profile at two different heights (60 nm and 200 nm) is also reported in FIGS. 5a and 5b.

The magnetic SOSD is clearly not uniform and takes the highest value at the edge of the constriction or at its center, depending on the height value from the constriction itself. For the above-mentioned rectangular constriction, the maximum value of the field curvature is at a height of approximately 100 nm. This fact means that, if coupling with the SOSD, the highest sensitivity is achieved if the mechanical sensor is placed at about that position.

Figure 2A:
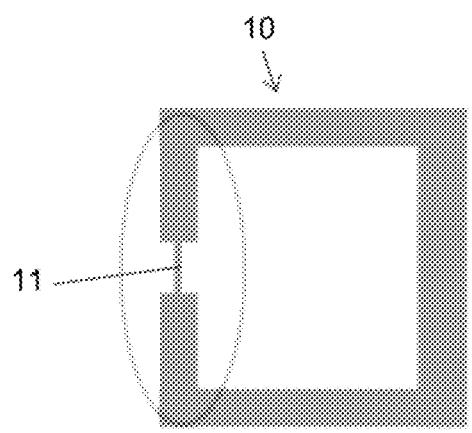
FIGS. 2a, 2b, 2c, 2d, 2e show embodiments of a superconducting ring with different constrictions.
Figure 2B:
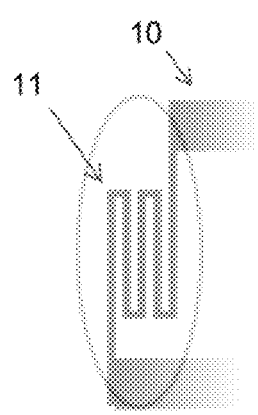
Figure 2C:
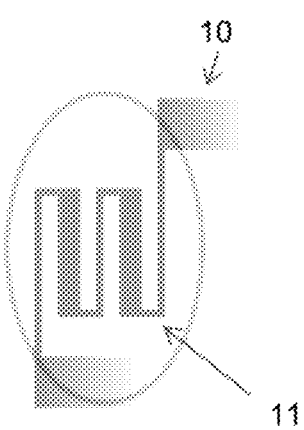
Figure 2D:
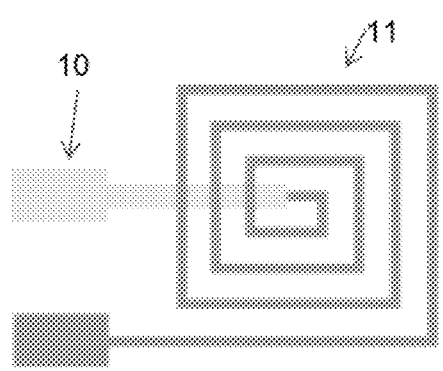
Figure 2E:
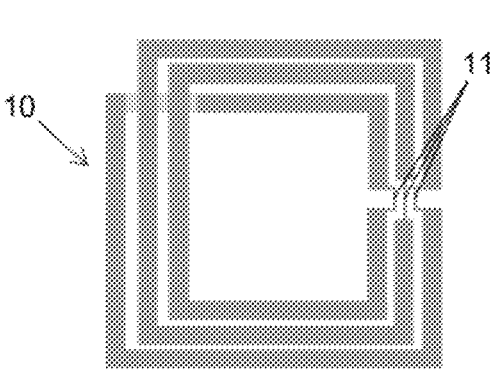

The magnetic coupling can be enhanced by summing the magnetic field generated by different SC constrictions coupled to the mechanical sensor. This operation can be realized by means of the meander-like structure of FIG. 2b. In some cases, to avoid cancelling of the field and its derivatives by the supercurrent flowing in the two opposite directions, asymmetrical structures can be designed (FIG. 2c). In fact, the value of the magnetic field and its derivatives decrease when increasing the constriction width (maintaining a constant value of the supercurrent). This fact means that, if the mechanical sensor is placed on top of the SC structures reported in FIGS. 2b and c, multiple couplings of different magnitudes can be properly designed and multimodal excitation and detection schemes can be employed. In the spiral-type configuration of FIG. 2d, a definite number of constrictions can be engineered to make the supercurrent flowing along the same direction in a given portion of the structure. As an alternative, multiple parallel constrictions can be obtained using a spiral-like design for the superconducting ring, as in FIG. 2e. The gain of this configuration is very similar to FIG. 2a, but a lower current will flow in the ring ensuring robustness in external applied fields as in ULF-MRI.

Possible Device Architectures

In the following text, possible device architectures are discussed. The presented architectures are divided conceptually, considering the main driving concept.

The device senses through a mechanical oscillator. For this reason, the mechanical quality factors Q of the oscillator is a fundamental parameter in determining the minimum detectable magnetic field. The device works in a vacuum chamber or in vacuum packaging.

A) Mechanical Resonator Coupled in Stacked Geometry (FIGS. 6a-b)

In this configuration, the mechanical structure is partly positioned on top of the superconducting constriction 11. This architecture allows to maximize the coupling with the superconducting constriction at the expense of a more complex fabrication protocol. Different mechanical resonators are considered as follows.

Magnetic cantilever (FIGS. 6a-6a'): in this configuration the microcantilever 20 is positioned perpendicular to the constriction axis (y-direction). A fixed anchor point of the cantilever is designated with 20a, while the vibrating structure of the cantilever is designated with 20b. The microcantilever 20 is made of magnetic material or covered by a magnetic material in selected areas. The magnetization M of the cantilever is oriented along the x-direction due to shape anisotropy, as indicated by the arrow. The cantilever oscillates along the z-direction (flexural mode) and is force-coupled at its end to the constriction by the SOSD of the $H_x$ field component along the z-direction.

The gap distance g of the cantilever from the constriction 11, roughly in the order of few hundreds of nanometers, is optimized in order to position the mechanical structure in the region with the highest value of the second-order magnetic field derivative. The constriction 11 is made of a single SC constriction with width $w_c$ or a meander-like structure with appropriate design. FIG. 6a' also shows a substrate 30 on which the superconducting loop 10 is deposited, and a spacer 31 provided at the anchor point 20a between the mechanical oscillator 20 and the substrate 30.

The dimension of an exemplary microcantilever could be approximately: L=50 µm, W=5 µm, T=200 nm, g=150 nm, the width $w_c$ of the constriction in the 100-200 nm range.

Magnetic microbridge (FIG. 6b-6c): A magnetic microbridge 20 is made of a magnetic material or covered by a magnetic material in selected areas. The dimensions of the microbridge are similar to those mentioned for the microcantilever, with the exception of the thickness that can be thinner, as the structure is doubly-clamped. A magnetic microbridge is positioned perpendicular to the SC nanoconstriction 11. The interaction with the supercurrent is similar to the previous case, as the magnetization is oriented along the x-direction. The coupling force acts mainly over the magnetic regions positioned above the SC structure(s), while the dynamical behaviour of the microbridge is affected by different contributions. Meander-like structures may also be used in order to force-couple with the oscillating structure in selected points, such as the nodes and the anti-nodes of selected vibration modes (FIG. 6c).

At first, the gradient of the magnetic force, similarly to the case of the magnetic cantilever, introduces an additional stiffness to the beam equation, which may lead to hardening or softening of the spring constant, depending on the magnitude and sign of the magnetic force gradient and the structural stiffness. This may introduce mixed and/or non-linear effects in the resonance frequency of the microbridge. Secondly, the magnetic force (that scales with the magnetic field gradient) may deflect the beam and increase its axial tension with effects on the resonance frequency of the structure. Thirdly, the magnetic field itself generated by the SC constriction may also change the tension and the shape of the microbridge by magnetostrictive effects, depending on the material and direction of the field itself with respect to the magnetization of the magnetic regions. The magnetic field itself also generates a torque on the mechanical structure that may also shift the mechanical resonance frequency. The amount of the shift in the mechanical resonance frequency as a function of the external magnetic field, and thus the final responsivity of the device, depends on the above set of parameters, and the balance between the different effects can be adjusted to a large extent by the choice of the microbridge dimensions, its magnetic structure and the operating distance g.

Summarizing, the magnetic field, generated by the SC constriction, its gradient and higher order spatial derivatives may couple with the mechanical resonator through selected regions of magnetic material. Such a coupling will profoundly affect the shape, the stress and the dynamical behaviour of the resonating element, thus affecting its mechanical resonance frequency. The direction of the magnetization of the magnetic material may be shaped by appropriate nanostructuring of the magnetic elements in order to improve the coupling with the selected mode of operation of the device. FIG. 6d shows an embodiment where a magnetic layer 21 is patterned into stripes to maintain the magnetization along the axial direction of the microbridge and, at the same time, couple with the superconducting constriction 11 in selected portions along the bridge length. The resonator may be also composed by magnetic materials in the form of films or patterned structures with specific magnetostrictive coefficient. Magnetic materials having a definite value of magneto-crystalline anisotropy may be also employed to force the magnetization of the mechanical resonator in a particular direction.

Seesaw lever (FIGS. 7a-c): a resonator 20 having the geometry reported in FIG. 7 rotates around an anchor point 20a. A part 21 of the resonator is covered by magnetic material and coupled with the superconductive constriction 11 through the above-discussed modes. The reading of the resonator oscillations can be done on a different place, to decouple the active region with the readout region of the resonator. For instance, the readout can be done with capacitive coupling 40 between a moving electrode 22 on the seesaw lever and a fixed electrode 42 on the cap wafer 51. The device wafer 52 and the cap wafer 51 are bonded in order to ensure vacuum, while the electric signal is carried out using metal vias in the cap wafer 51.

B) Mechanical Resonator Coupled in Lateral Geometry (FIGS. 8a-b)

The resonating structure 20b is placed aside the constriction 11. This configuration makes use of fringing fields and might facilitate the fabrication processes hampered by the delicateness of High-Tc superconducting materials to chemical substances. Examples of possible device architectures are reported in FIG. 8a, where the mechanical oscillator 20 is formed as a cantilever and the constriction 11 is formed as a straight strip, and in FIG. 8b, where the mechanical oscillator 20 is formed as a bridge and the constriction 11 is formed as a meander-wise strip.

C) Architectures Based on In-Plane Resonators (FIG. 9)

The above discussed embodiments operate with out-of-plane movements of the oscillating structures (z direction, left side of FIG. 9). However, the same device structures (i.e. cantilevers and microbridges) previously described can operate also with in-plane oscillations and couple—as a non-limiting example—with the second order derivative of the $H_x$ field along the x-direction. In such a case, preferential lateral movement is achieved by realizing structures with a larger height-to-width ratio T/W (right side of FIG. 9).

D) Freestanding Superconducting Microbridges Coupled to the Superconducting Constriction.

A possible alternative architecture employs a superconducting microbridge in place of a microbridge made of magnetic material. In such a case, the superconducting microbridge couples with the magnetic field generated by the SC constriction and acts as a perfect diamagnetic element. The force generated by such a coupling is employed to drive the mechanical resonator or to change its mechanical resonance frequency. The architectures for such a configuration follows the same ones above-mentioned for the magnetic microbridges.

E) Freestanding Superconducting Microbridges Coupled to a Permanent Magnetic Field (FIG. 10)

Another possible alternative architecture merges the SC constriction and the resonator into a unique structure with two roles. In this embodiment, the superconducting constriction 11 is made freestanding as a bridge. The superconducting constriction 11—part of a superconducting loop 10-works both as B-field generator on its surroundings and as a micro/nanomechanical resonator 20. This structure is set into mechanical oscillation and interacts with a permanent magnet 55 formed—for example—by a thin film of magnetic material. The circulating supercurrent couples with a shaped magnetic field generated by the permanent magnet 55 (Lorentz force) that acts as a load that in turn changes the resonance frequency of the freestanding superconducting element 11. The shaped magnetic field can be also designed in order to produce a force gradient along any of the two directions of the cross-section of the SC constriction 11 so affecting the resonance frequency of the entire mechanical structure.

The freestanding element 11 is mechanically excited at its resonance by—for example—an external piezoelement, electrostatic field or light along a selected mode of vibration. Readout of the mechanical oscillation could be made—for example—by optical and electrical methods using the same methods discussed for the previous device configurations. A possible architecture for this device is reported in FIG. 10. Changes of the resonance frequency through the superconducting constrictions are thus proportional to the external magnetic field concatenated with the SC loop.

Materials for the Realization of the Sensor

The hybrid sensor is made of materials having different functionalities and roles, as for example materials exhibiting superconductivity, magnetism, electrical conduction and particular mechanical and structural properties. The device can be realized monolithically, employing the technique of surface micromachining and multistep deposition processes. In a different embodiment, the superconducting field focuser is coupled with the resonator through flip chip/wafer bonding, as it enables the decoupling of the two fabrication processes, but with less precision than a fully monolithic process.

The superconducting materials for the loop 10 and constriction 11 can be niobium, with a critical temperature of about 9 K, or cuprates such as YBCO, with a superconducting temperature of 90 K. Niobium requires the use of liquefied helium at 4.2K, while for YBCO liquefied nitrogen at 77 K can be employed.

The resonator 20 can be made of transition metal oxide (TMO) materials. In such an embodiment, TMO compounds may cover all the functional and structural aspects of the hybrid sensor. The hybrid sensor can be made of thin epitaxial films of TMO. The hybrid sensor can be thus realized using a fully monolithic process taking the advantages of the different etching rates of the oxide compound layers. In a different embodiment, the hybrid sensor can be also realized by a combination of oxide materials—such as cuprates—and silicon, taking advantage from the techniques and protocols typical of silicon technology. In particular, to integrate the silicon-based resonator with the superconducting loop, the most suitable solution is flip chip/wafer bonding.

Detection and Mechanical Excitation Techniques

Movement of the resonator 20 can be detected with different techniques.

Self-Sensing Detection Technique:

The piezoresistive or piezoelectric effect can be used for self-sensing. The mechanical oscillator 20 itself could be made from piezoresistive or piezoelectric material or a piezoresistive or piezoelectric thin film could be deposited onto it. This solution has the disadvantage of introducing additional wiring of the device and may enhance the crosstalk between the sensors in applications such as Magnetoencephalography. However, this solution should work better for applications where simplicity of the device readout is a priority. Vacuum operations could be also employed in order to increase the Q-factor of the mechanical resonator.

Optical Detection Technique:

Compared to the electric self-sensing signal, optical detection schemes are much less susceptible to electromagnetic noise sources. Both, laser beam deflection as well as fiber based optical interferometry could be used. The latter scheme is preferable, because it can be more compact and scaled to multiple channels in a straightforward way and multiplexed using off-the-shelve components from fiberoptic telecom networks. When using optical fibers, light source and read-out electronics can be located far away from the mechanical oscillator, thus minimizing the effects of parasitic electromagnetic fields from the electronics.

In a fiber based interferometric detection scheme the mechanical oscillator can act as a mirror or it can be placed inside of an optical cavity. In the latter case, the mechanical properties of the oscillator and the optical properties of the cavity can be optimized independently. For instance, if the mechanical oscillator also acts as a mirror, a coating that increases the reflectivity and thus the finesse of the interferometer, regrettably, also would increase the spring constant and reduce the Q-factor. On the other hand, coating the mirrors of an optical cavity would not affect the spring constant of the mechanical oscillator at all. FIG. 11 shows a selection of different possibilities to realize a fiber based optical detection. A fiber is designated with 60, and a fiber end facing towards the mechanical oscillator 20 is designated with 63. FIG. 11(a) shows a fiber-based two-beam Michelson interferometer. The incident laser beam is designated with IB, laser light reflected by the mechanical oscillator 20 is designated with RB1, and laser light reflected by the fiber end 63 is designated with RB2. FIG. 11(b) shows that the finesse can be enhanced by increasing the reflectivities of mechanical oscillator and fiber end (multiple beam interference). A reflective coating 61 is deposited on the mechanical oscillator 20. Further improvement is possible by using a curved fiber end. Accordingly, FIG. 11(c) shows a cavity design. The mechanical oscillator 20 is placed inside the cavity 62 and is thus not part of the cavity itself. Both fibers 60, 60a can be used for detection, i.e., in reflection or transmission. Geometrical constraints require a pendulum geometry. Curved fiber ends and reflective coating enhance the finesse. FIG. 11(d) shows a cavity design with an integrated second mirror 64. Detection is only possible in reflection.

To set the optimal operating point for interferometric detection schemes, one needs to tune the optical path length between the interfering beams. This can be achieved either by changing the distance between the mirrors (for instance using piezoelectric elements) or preferably by choosing a wavelength that matches with the gap between the resonator and the mirror. This can be implemented by using laser sources with an adjustable wavelength. The signal from the interferometer represents the position of the beam. The changes in resonance frequency can be tracked by using a phase-locked loop, or by a frequency downconversion scheme (homo- or heterodyne detection).

Depending on the displacement of the resonator and the resolution of the interferometer, the oscillator motion due to Brownian fluctuations (thermomechanical noise) can be detected, or the resonator could be actively driven near one (or more) of its resonance frequencies as to increase its displacement. In the latter case, the driving force could be the photo-thermal or photostrictive effect, which is preferably applied via the same fiber that is used for the motion detection. To eliminate the effects of viscous damping due to air friction, which give rise to a low Q-factor, the resonator is ideally placed in vacuum.

Mechanical Excitation Techniques:

To drive the oscillator 20 into oscillations, several options are at hand:

(i) Mechanical excitation with a piezoelectric actuator placed close to the mechanical oscillator. The piezoelectric actuator requires wiring.

(ii) Photothermal or photostrictive excitation with 1) a second laser beam focused onto the base of the mechanical oscillator, or 2) modulation of the (same) probe laser near the mechanical resonance frequency as to parametrically amplify the (Brownian) motion or induce parametric resonance. These solutions can be operated without any wiring on the device.

(iii) Self-excitation of a piezoelectric mechanical oscillator using direct or parametric feedback.

(iv) Capacitive coupling in case of conductive materials. This requires wiring and addition of electrical signals.

Detection Channel Using the Hybrid Sensor

The hybrid sensor can be integrated into a detection channel that probes the samples magnetic field and transfers the data to the acquisition system. A possible application is related to biomagnetism. FIG. 12 shows a schematic of the readout channel (the biomagnetic channel). Parts of the system, including the specimen to be imaged, are located inside a magnetically shielded area. The field concentrator 11, the mechanical resonator 20 and the optical fiber 60 are inside a cryostat 80, which will comprise multiple readout-channels. Everything is located inside a magnetic shield 70. Ideally, there are no electrical currents inside the magnetically shielded area and the optical fiber 60 is used for both the excitation and the position measurement of the mechanical resonator 20.

Three components require critical mechanical alignment:
Field concentrator 11 and mechanical resonator 20 need to be positioned as to maximize the coupling (magnetic field, magnetic field gradient, second order spatial derivative, . . . ) for a chosen architecture and mode of operation. This may be achieved by flip chip/wafer bonding or a jig that enables a passive lateral alignment, making use of fiducial marks.

Mechanical resonator 20 and optical fiber 60 need to be positioned as to maximize the optical signal of the resonator. A jig could be used for this purpose, or a piezoelectric positioner. A better option is to adjust the wavelength of the interferometer laser to match the distance between the mirrors. This can be done without introducing electromagnetic interference. In addition, a passive aligner based on a fiber clamp connected to a flexible hinge could be used to adjust the lateral position between the fiber tip and the resonator.

At the detector side, the optical fiber 60 is coupled to a photodiode and an excitation source 90. These adjustments are accessible and occur at room temperature, which makes them less critical.

The detector and adapter electronics 100, which could be implemented partly in the digital domain, comprise analog and digital circuits that generate the excitation signals and demodulate the displacement, producing a response signal depending on the biomagnetic field at the superconducting loop.

Biomagnetic fields generated by brain activity range in the dc-4 kHz band, while those generated in an ULF/VLF NMR system include frequencies in higher bands (1-40 kHz for ULF NMR, 40-500 kHz for VLF NMR). For biomagnetic applications, the impedance and the bandwidth of the readout channel will be matched to the existing imaging systems available in the market. As an example, for ULF/VLF NMR, the readout channel will be available as a 50Ω analog output at a bandwidth of 1-500 kHz to be handled by the MR console.

The hybrid sensor can be thus combined with a dedicated readout system suitable for operation in biomagnetic instrumentation such as MEG, ultra/very Low Field MRI and combined MEG/ultra/very Low Field MRI/TMS systems.

SQUID based channels work using a feedback coil in order to nullify the magnetic field concatenated with the SQUID loop. This is done to maintain a linear response of the device, as the SQUID does not move from its selected working operation point. In the above described architecture, apart from the common solution employing a feedback coil, an external incident light can be modulated in power in order to maintain the resonance frequency of the resonator at a constant fixed value. The signal of the modulated light can be controlled by, for example, a Phase Locked Loop system that would act in feedback configuration. The resonator frequency can be thus modulated exploiting forces generated by light, using cavity optomechanical schemes or by changing the internal stresses of the structures with heating (exploiting thermal expansion of materials) or photostrictive effects.

SQUID based systems cannot be integrated with TMS since they are not robust to applied field over 150 mT in the case of field-tolerant designs (they are damaged at much lower fields in case of standard designs). Conversely, the hybrid sensor is intrinsically robust to applied fields in the order of tenths of Tesla since both the resonator and the field to gradient converter will not be damaged. However, if the hybrid sensor is used together with TMS, fields in the order of Tesla will be generated close to the scalp and the device. In such extreme operation conditions, to ensure the safety of the sensor and avoid any possible risk to damage the superconducting constriction, a single compensation coil driven by a suitable current could be installed for each channel. An alternative solution will be to use a set of compensation coils for the whole multichannel sensing array. For both configurations, the requirement of the compensation coils is to reduce the field at the device to the order of tenths of Tesla.

A picture of a possible realization of the optical readout platform, the biomagnetic channel and the envisaged new MEG system is reported in FIGS. 13-16.

FIG. 13 shows a cross section of a biomagnetic (MEG) channel that is based on the above-described technology. The MEG system may consist of a large number (>100) of such channels. This channel is contained in a Dewar filled with a coolant, such as liquid nitrogen. An inner shell and an outer shell of the Dewar are designated with IS and OS, respectively. Vacuum is formed between the inner shell IS and the outer shell OS. The outer shell OS can be placed close to, or in contact with a sample whose magnetic field is to be detected, such as for instance the subject's head. In the embodiment shown in FIG. 13, the biomagnetic channel could be embedded in the inner shell IS and thus placed closer to the magnetic field source. We name the channel in this embodiment as the "embedded module", identified as 200 and described in the following. In an alternative embodiment, the channel could be placed in a vacuum-tight packaging. We will name this version the "standalone module". An array of these modules could be placed in a sensor holder inside a Dewar.

The embedded module 200 comprises a sensor chip 210, a chip carrier 220, a sensor housing 230, and a vacuum feedthrough 240. The outside of the sensor housing 230 is in contact with the liquid nitrogen bath. The inside of the sensor housing 230, and parts it includes such as the sensor chip 210, are in the vacuum. In the embodiment shown in FIG. 13, the embedded module 200 can be integrated in the Dewar. Specifically, to separate the liquid nitrogen area from the vacuum area, the embedded module is mounted on the inside shell IS as a part of the Dewar bottom. A vacuum seal 231 is interposed between the sensor housing 230 and the inner shell IS. The superconducting circuit 10 and the mechanical resonator 20 are integrated on the sensor chip 210, which is mounted on the chip carrier 220. The chip carrier 220 in turn is mounted in the sensor housing 230 that holds the optical fiber 60 that enters through the vacuum feedthrough 240. The chip carrier 220 and the sensor housing 230 are made of a thermally conducting material, (e.g. sapphire).

An adjustment system, preferably implemented using a parallel guidance system based on flexural hinges 250, enables positioning of the tip of the optical fiber 60 with respect to the mechanical resonator 20. To reduce friction and obtain a high Q-factor, the mechanical resonator operates in the vacuum. Venting holes 260 are present to ensure controlled evacuation of the space around the mechanical resonator. The space created to fabricate the flexural elements 250 may serve for this purpose. The required optomechanical coupling is obtained by utilising the adjustment screws 270 (only one is shown in FIG. 13; this solution requires sealant to keep the vacuum) while monitoring the output signal from the detector. Additional screws may be present to adjust multiple degrees of freedom, and to fix the fiber after the adjustment is finished. In a different embodiment, adjustment of the optical fiber 60 can be operated from the top or the bottom so that the optomechanical coupling can be adjusted after mounting the embedded channel on the IS. The screws can be adjusted through a piezoelectric control. The wires for the piezoelectric control can be placed in the vacuum chamber of the Dewar. The fiber tip may be equipped with a ferrule 280 to facilitate the fixation in the movable part of the adjustment system. The optical fiber 60 enters the sensor housing 230 through a vacuum feedthrough 240, that is designed to enable an easy removal and re-insertion of the fiber. This makes the replacement of the fiber or the sensor possible. In the standalone embodiment, the sensor housing 230 and the chip holder 220 are sealed together. The wires for the control can be fed to the piezoelectric material through the sensor housing 230 in the standalone module.

FIG. 14 shows a schematic top view of the same design. Note that a square geometry is chosen as to enable close packing of the channels in a MEG helmet. In another configuration, the sensor housing may have a circular cross-section, which is easier to fabricate.

A closer view on the fiber positioning is given in the detailed top-view of the position of the fiber tip with respect to the mechanical resonator, presented in FIG. 15. The optical fiber 60 with the ferrule 280 (ferrule is not shown in this figure) is in proximity of, or in contact with, the sensor chip 210 that contains the mechanical resonator 20. In this implementation, the fiber core 60' faces the mechanical resonator through a hole 211 in the sensor chip 210. Using the adjustments 250, 270 the fiber core 60' can be aligned along the directions xy towards the mechanical resonator 20. The insets (b) and (c) show examples of an aligned and a non-aligned fiber.

FIG. 16 shows a detailed cross-section of the position of the fiber tip with respect to the mechanical resonator 20. The fiber 60 and/or the ferrule 280 are inserted and stop on a top wafer 212. The interferometer is formed by the fiber tip and the mechanical resonator 20. In this implementation, the mechanical resonator 20 vibrates in the motion direction MD, and its position can be obtained interferometrically by using the fiber tip as a fixed mirror and the mechanical resonator 20 as the moving mirror. This fiber interferometry method has been described previously. The constriction 11 is deposited on a bottom wafer 213. A spacer 214 is interposed between the bottom wafer 213 and the top wafer 212. The bottom wafer 213 and the top wafer 212 form a housing structure of the sensor chip 210, and contain the mechanical oscillator 20 and the superconducting loop 10 with constriction 11.

FIG. 17 shows an example circuit that combines driving and motion detection through a single optical fiber. Such a circuit is disclosed in celik et al., Rev. Sci. Instrum. 88, 013705 (2017). A similar strategy is expected to be viable for the MEG channel, and could be placed outside the MEG shielded room. In the scheme, PD designates a photodiode, VCO designates a voltage controlled oscillator, and PLL designates a phase locked loop.

The invention claimed is:
1. A device for sensing a magnetic field, comprising
   a closed superconducting loop configured to collect a magnetic field to be sensed, hereinafter external magnetic field, said closed superconducting loop having a path width ($w_p$) and being provided with a constriction having a width ($w_c$) narrower than said path width, said constriction producing a non-uniform magnetic field on its surroundings, hereinafter internal magnetic field, in response to said external magnetic field,
   a vibrating mechanical oscillator coupled to, or formed by said constriction and responsive to the internal magnetic field, and
   a detector configured to detect deflection or vibration of said mechanical oscillator and providing a signal indicative of said deflection or vibration.
2. A device according to claim 1, wherein said vibrating mechanical oscillator is configured to change its mechanical resonance frequency in response to said internal magnetic field.
3. A device according to claim 1, wherein said mechanical oscillator is coupled to said constriction through the internal magnetic field, a first order spatial derivative of the internal magnetic field or a second order spatial derivative of the internal magnetic field.
4. A device according to claim 1, wherein at least one portion of the mechanical oscillator is made of magnetic material and is positioned close to said constriction.
5. A device according to claim 4, wherein the said magnetic material comprises nanostructured ferromagnetic elements.
6. A device according to claim 1, wherein at least one portion of the mechanical oscillator is made of magnetostrictive material and is positioned close to said constriction.
7. A device according to claim 1, wherein at least one portion of the mechanical oscillator is made of superconducting material and is positioned close to said constriction.
8. A device according to claim 1, wherein said mechanical oscillator comprises at least one fixed anchor point and a vibrating structure connected to said anchor point.
9. A device according to claim 1, wherein said constriction is formed as a straight or meander-wise or spiral-type stripline, or wherein the closed superconducting loop is spiral-type.

10. A device according to claim 1, wherein said constriction is formed as a bridge and is configured to form said vibrating mechanical oscillator, a fixed permanent magnet being positioned close to said constriction.

11. A device according to claim 1, wherein said detector is an optical detector based on laser beam deflection or optical interferometry by a laser beam coupled to said mechanical oscillator.

12. A device according to claim 1, further comprising a containing structure (OS, IS, 230) in which a vacuum chamber is formed, said vacuum chamber receiving the closed superconducting loop and the mechanical oscillator.

13. A device according to claim 12, wherein said detector comprises an optical fiber at least partially received in said vacuum chamber, wherein the closed superconducting loop and the mechanical oscillator are carried by an holder, wherein the optical fiber is carried by a ferrule movable relative to said holder, adjustment means being interposed between the holder and the ferrule to enable adjustment of position of a tip of the optical fiber relative to the mechanical oscillator.

14. A device according to claim 12, wherein said optical fiber is run to the mechanical oscillator through a vacuum feedthrough for feeding vacuum to said vacuum chamber, said vacuum feedthrough being formed through said containing structure.

15. A device according to claim 12, wherein said containing structure is configured to be placed at least partially in thermal contact with a cooling bath to cool the device to a temperature not more than a superconductor critical temperature.

16. Apparatus for sensing a magnetic field, said apparatus comprising a plurality of channels wherein each of said channels comprises a device according to claim 12.

\* \* \* \* \*